United States Patent
Asou et al.

(10) Patent No.: US 8,933,339 B2
(45) Date of Patent: Jan. 13, 2015

(54) DIFFERENTIAL PATH REPLACEMENT COMPONENT, PRINTED BOARD, AND ELECTRONIC DEVICE

(75) Inventors: Kouichiro Asou, Kawasaki (JP); Toshihiro Miyamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 224 days.

(21) Appl. No.: 13/232,094

(22) Filed: Sep. 14, 2011

(65) Prior Publication Data

US 2012/0002383 A1 Jan. 5, 2012

Related U.S. Application Data

(63) Continuation of application No. PCT/JP2009/056561, filed on Mar. 30, 2009.

(51) Int. Cl.
*H05K 1/09* (2006.01)
*H05K 3/22* (2006.01)
*H05K 1/02* (2006.01)
*H05K 1/18* (2006.01)

(52) U.S. Cl.
CPC .............. *H05K 3/222* (2013.01); *H05K 1/0245* (2013.01); *H05K 1/182* (2013.01); *H05K 2201/10287* (2013.01); *H05K 2201/10636* (2013.01)
USPC ............................ 174/251; 174/261; 333/236

(58) Field of Classification Search
CPC ....... H05K 3/222; H05K 1/0245; H05K 1/82; H05K 2201/10636; H05K 2201/10287
USPC ...... 174/70 C, 72 C, 96, 98, 113 R, 250, 251, 174/257, 261; 333/236
See application file for complete search history.

(56) References Cited

U.S. PATENT DOCUMENTS

| | | | |
|---|---|---|---|
| 3,761,842 A * | 9/1973 | Gandrud | 333/1 |
| 6,057,512 A * | 5/2000 | Noda et al. | 174/250 |
| 6,300,846 B1 * | 10/2001 | Brunker | 333/1 |
| 6,433,272 B1 * | 8/2002 | Buhler et al. | 174/27 |
| 6,774,741 B2 * | 8/2004 | McCurdy et al. | 333/1 |
| 6,825,410 B2 * | 11/2004 | Chou | 174/27 |
| 2004/0094328 A1 * | 5/2004 | Fjelstad et al. | 174/251 |

FOREIGN PATENT DOCUMENTS

| | | |
|---|---|---|
| JP | 61-259467 | 11/1986 |
| JP | 3-71571 | 7/1991 |
| JP | 6-342964 | 12/1994 |
| JP | 2004-95786 | 3/2004 |
| JP | 2006-67543 | 3/2006 |

OTHER PUBLICATIONS

International Search Report for PCT/JP2009/056561, mailed May 26, 2009.

* cited by examiner

*Primary Examiner* — Hoa C Nguyen
(74) *Attorney, Agent, or Firm* — Staas & Halsey LLP

(57) ABSTRACT

A differential path replacement component includes: a first signal line that comprises one end and the other end; and a second signal line that comprises one end adjacent to one end of the first signal line and the other end adjacent to the other end of the first signal line, that transmits a signal having a phase opposite to a phase of a signal transmitted through the first signal line, and that is paired with the first signal line. The first and second signal lines are twisted together such that an arranged sequence of one end of the first signal line and one end of the second signal line is reversed to an arranged sequence of the other end of the first signal line and the other end of the second signal line.

12 Claims, 10 Drawing Sheets

DIFFERENTIAL PATH REPLACEMENT COMPONENT, PRINTED BOARD, AND ELECTRONIC DEVICE

CROSS-REFERENCE TO RELATED APPLICATIONS

This application is a continuation application of PCT/JP2009/056561, filed on Mar. 30, 2009, the entire contents of which are incorporated herein by reference.

FIELD

The embodiments discussed herein are related to a differential path replacement component, a printed board, and an electronic device.

BACKGROUND

There is a differential transmission method for transmitting a signals having opposite phases through two signal lines, respectively, so as to transmit data. For example, the differential signals are transmitted between two electronic components mounted on the printed board through two wires patterned on the printed board.

In light of impedance matching or noise resistance, it is desirable that the interval between two wirings should be constant and the lengths thereof should be equal to each other. However, depending on positions of terminals of electronic components mounted on the printed board, the arranged sequence of the two wirings has to be changed. In such a case, it is difficult to make the interval between the two wirings constant and lengths thereof equal to each other.

SUMMARY

According to an aspect of the embodiments, a differential path replacement component includes: a first signal line that comprises one end and the other end; and a second signal line that comprises one end adjacent to one end of the first signal line and the other end adjacent to the other end of the first signal line, that transmits a signal having a phase opposite to a phase of a signal transmitted through the first signal line, and that is paired with the first signal line, wherein the first and second signal lines are twisted together such that an arranged sequence of one end of the first signal line and one end of the second signal line is reversed to an arranged sequence of the other end of the first signal line and the other end of the second signal line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments will be explained later with reference to the drawings.

Figure 1A:
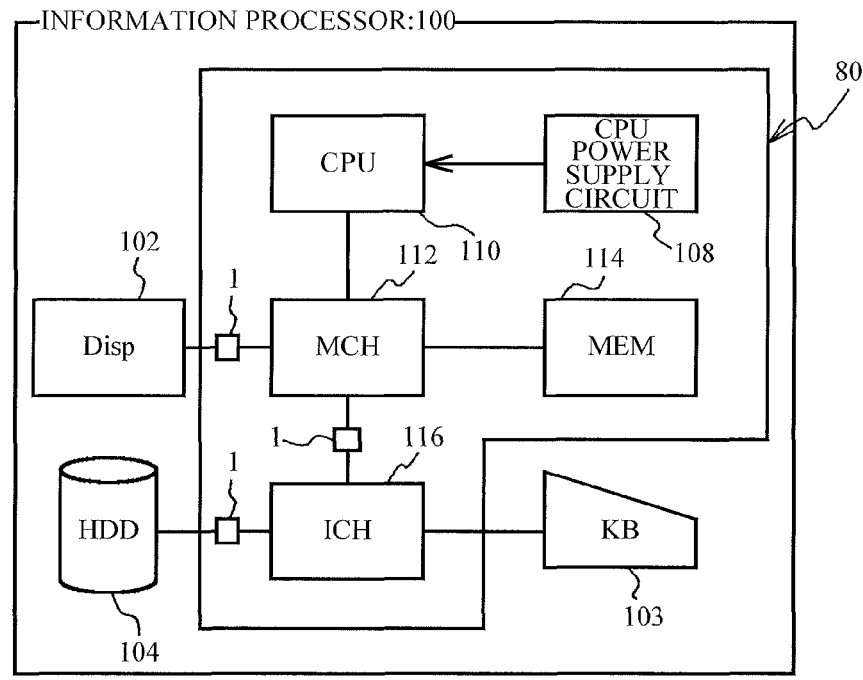
FIG. 1A is an explanatory view of an information processor.

FIG. 1A is an explanatory view of an information processor. For example, the information processor 100 is a notebook computer. The information processor 100 is an example of an electronic device. The information processor 100 includes: a printed board body (hereinafter referred to as printed board) 80; a keyboard 103; a display 102; and a hard disk 104. A CPU power supply circuit 108, a Central Processing Unit (CPU) 110, a Memory Controller Hub (MCH) 112, a Memory (MEM) 114, and an I/O Controller Hub (ICH) 116 are mounted on the printed board 80. The printed board 80 corresponds to a motherboard. Plural differential path replacement components (hereinafter referred to as components) 1 are mounted on the printed board 80. The components 1 are mounted on wirings connecting the MCH 112 and the ICH116, wirings connecting the MCH112 and the display 102, and wirings connecting the ICH116 and the hard disk 104, respectively.

Figure 1B:
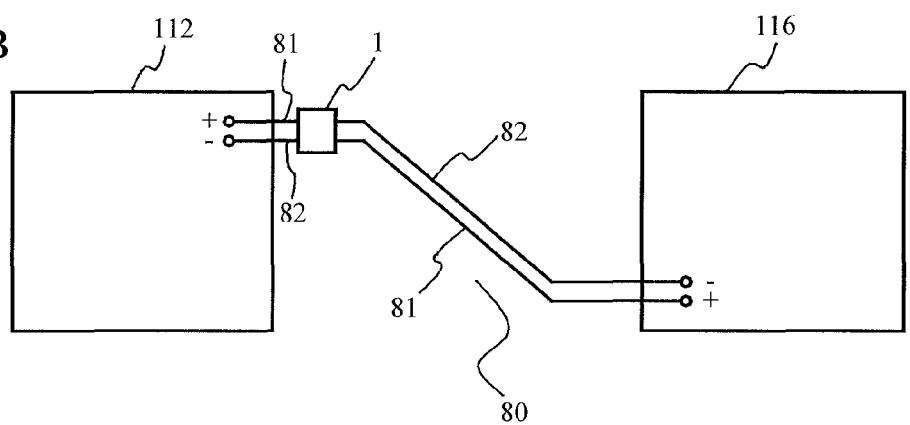
FIG. 1B is an explanatory view of differential transmission paths.

FIG. 1B is an explanatory view of differential transmission paths. As illustrated in FIG. 1B, the positional relationship between terminals of the MCH 112 is opposite to the positional relationship between the terminals of the ICH 116. The printed board 80 is provided with wirings 81 and 82 for the differential transmission between the MCH 112 and the ICH 116. The wiring 81 transmits a P (positive logic) signal as the differential signal, and the wiring 82 transmits a N (negative logic) signal as the differential signal. As illustrated in FIG. 1B, an order in which the wirings 81 and 82 are arranged is changed in the component 1, and then the connection between P-P and the connection between N-N are established in an original manner.

Figure 1C:
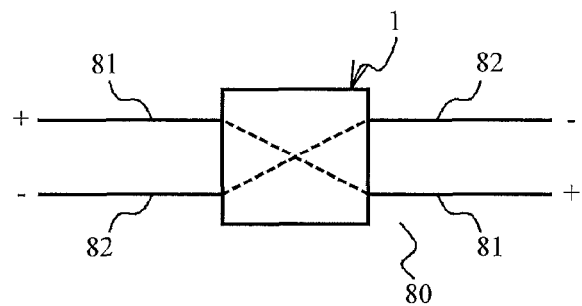
FIG. 1C is a schematic view of a differential path replacement component.

FIG. 1C is a schematic view of the component 1. As illustrated in FIG. 1C, the order in which the wirings 81 and 82 are arranged is changed within the component 1. An inner structure of the component 1 will be described later in detail.

Figure 1D:
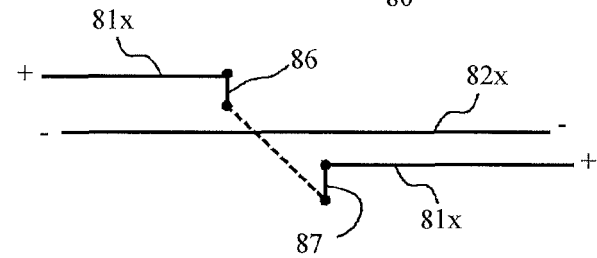
FIG. 1D is an explanatory view of another method for replacing wirings with each other.

In cases where the positional relationship between a positive terminal and a negative terminal of the electronic component is opposite to the positional relationship between a positive terminal and a negative terminal of the other electronic component mounted on the printed board, the transmission can be ensured by the following wiring manner. As illustrated in FIG. 1D, a wiring 81x of the wirings 81x and 82x provided on a first surface of the printed board is extended to a second surface thereof through a via 86. Next, the wiring 81x is arranged to be across with the wiring 82x, and the wiring 81x is extended to the first surface through a via 87 again. It is considered to change the order in which the two wirings 81x and 82x arranged in such a way. However, it is difficult for the lengths of the two wirings 81x and 82x to be equal to each other and for the interval thereof to be constant in this case. As will be described later in detail, by use of the component 1, the sequence in which the wirings are arranged can be changed with the interval between the wirings being constant and the lengths thereof being equal to each other.

Figure 2A:
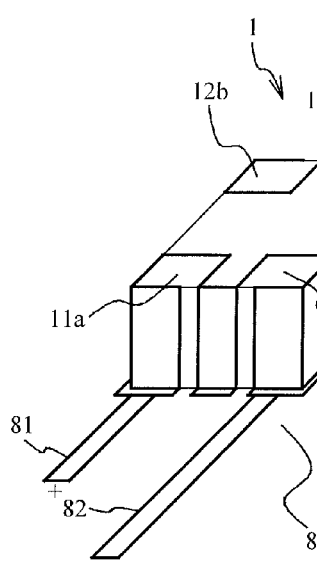
FIGS. 2A to 2D are explanatory views of the differential path replacement components.

Next, the differential path replacement component will be described. FIGS. 2A to 2D, 3A to 3D, and 4A to 4D are explanatory views of the differential path replacement components. The component 1 illustrated in FIG. 2A is mounted on the printed board 80. The component 1 includes a chassis 10. The two signal lines as will be described later are housed in the chassis 10. The chassis 10 has a substantial rectangular shape. For example, the chassis 10 is molded by an insulation material such as a synthetic resin. Lead frames 11a, 11b, 12a, and 12b are secured to the outer surface of the chassis 10. The lead frames 11a and 11b are electrically connected to each other through a single signal line within the chassis 10. Likewise, the lead frames 12a and 12b are electrically connected to each other through a single signal line within the chassis 10. The lead frames 11a and 11b are electrically connected to the wiring 81. The lead frames 12a and 12b are electrically connected to the wiring 82.

Figure 2B:
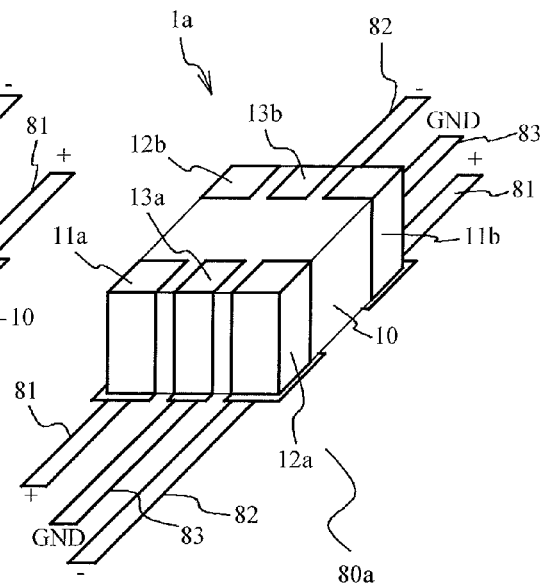

Lead frames 13a and 13b are secured to the outer surface of the chassis 10 of a component 1a illustrated in FIG. 2B. The lead frames 13a and 13b are electrically connected to a GND wiring 83 provided on a printed board 80a. The lead frames 13a are 13b are corresponding to ground terminals. The lead frame 13a is provided between the lead frames 11a and 12a. Also, the lead frame 13b is provided between the lead frames 11b and 12b. In cases where the wiring 81, the GND wiring 83, and the wiring 82 are arranged in this order, the component 1a can be employed.

Figure 2C:
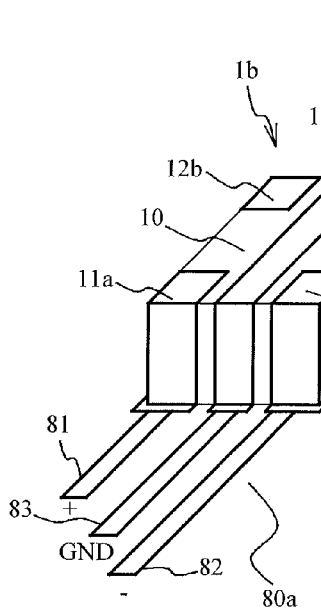
Figure 2D:
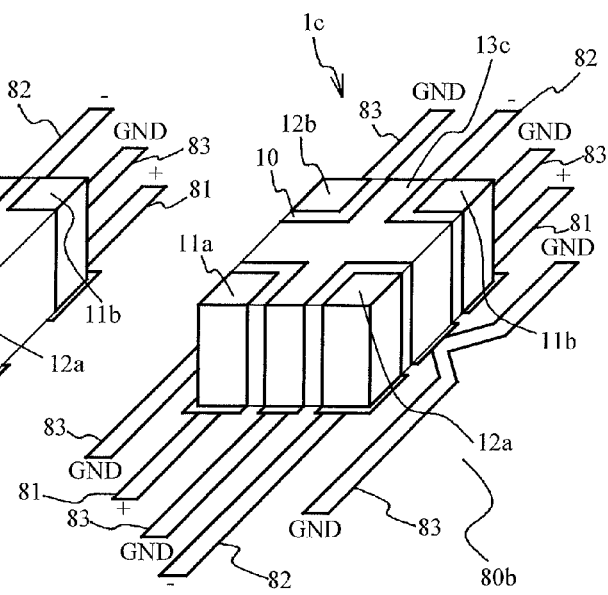

A lead frame 13 extending in a linear shape is secured to the outer surface of the chassis 10 of a component 1b illustrated in FIG. 2C. The lead frame 13 is connected to two GND wiring 83. A lead frame 13c having a cross shape is secured to the outer surface of the chassis 10 of a component 1c illustrated in FIG. 2D. In cases where the plural GND wirings 83 are provided on a printed board 80b, such a component 1c can be employed.

Figure 3A:
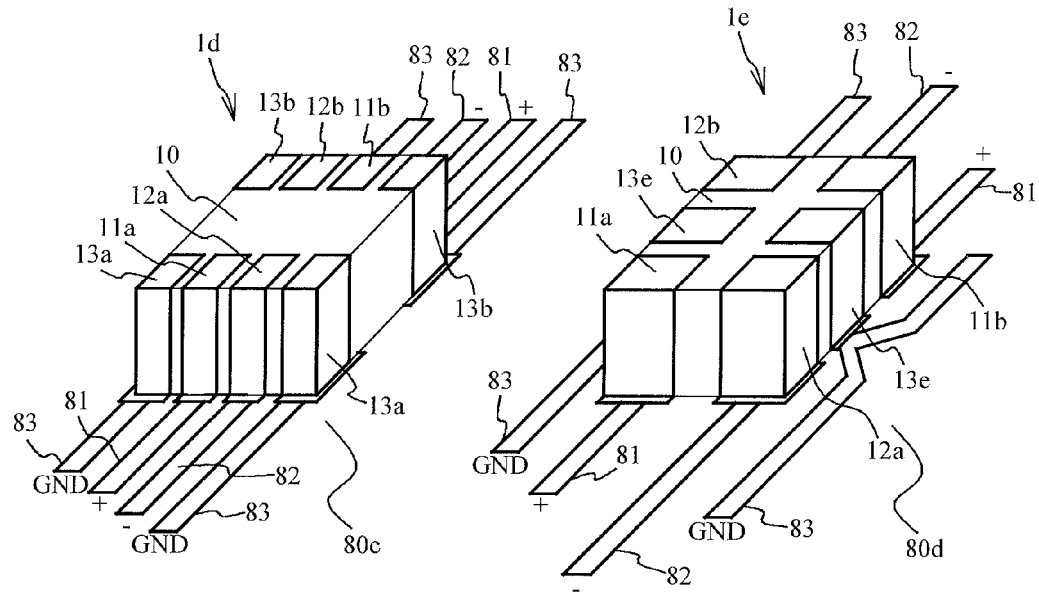
FIGS. 3A to 3D are explanatory views of the differential path replacement components.

Two lead frames 13a sandwich the lead frames 11a and 12a and are secured to the outer surface of the chassis 10 of a component 1d illustrated to FIG. 3A. Two lead frame 13b is secured thereto to sandwich the lead frames 11b and 12b. In cases where the GND wirings 83 are provided on the printed board 80c to sandwich the wirings 81 and 82, the component 1d can be employed.

Figure 3B:
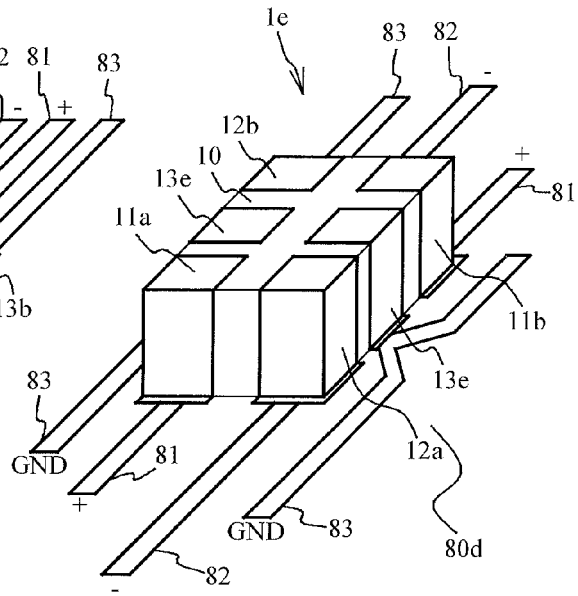
Figure 3C:
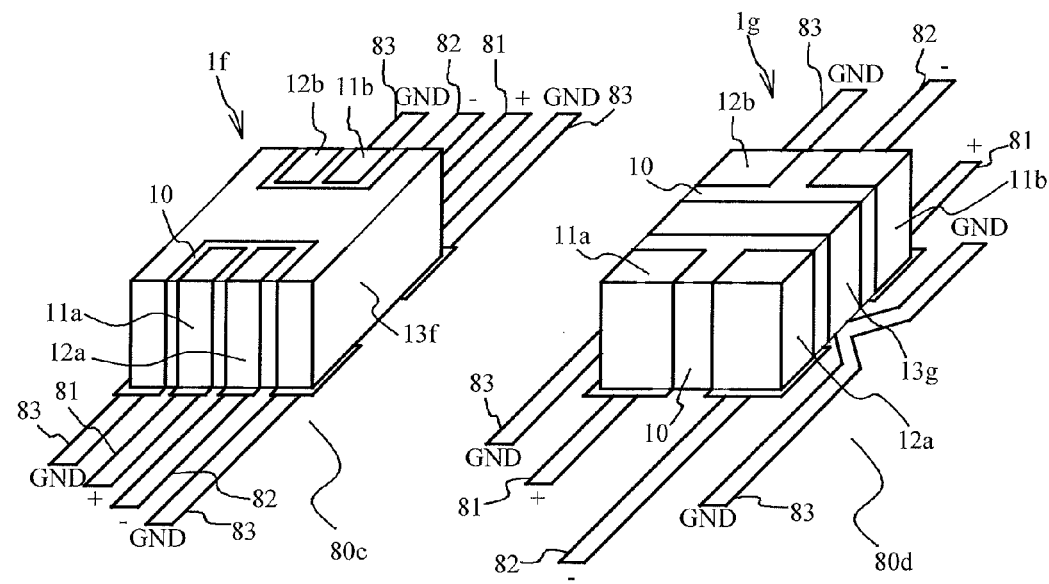
Figure 3D:
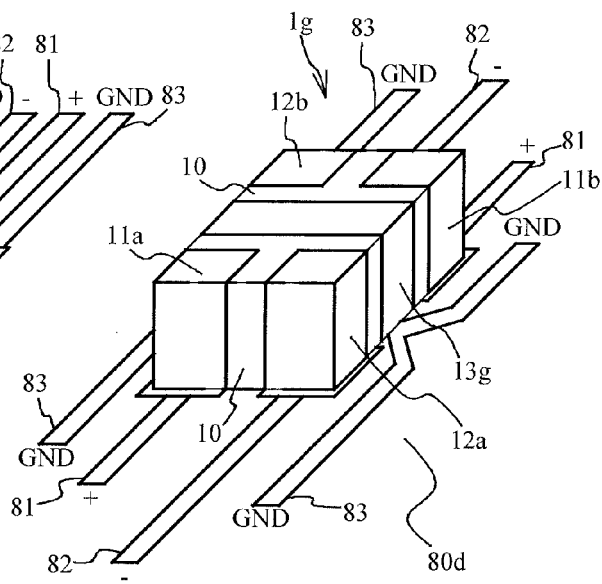

Two lead frames 13e are respectively secured at both sides of the chassis 10 of a component 1e illustrated in FIG. 3B. The two GND wirings 83 are provided on a printed board 80d to sandwich the wirings 81 and 82. In cases where the GND wirings 83 and the wirings 81 and 82 are spaced away from one another, the component he can be employed. A lead frame 13e is secured to the outer surface of the chassis 10 to cover a substantially whole area except for the lead frames 11a, 11b, 12a, and 12b. A lead frame 13g extending in a lateral direction of the chassis 10 is secured to the outer surface of the chassis 10 of a component 1g illustrated in FIG. 3D. Therefore, the two GND wirings 83 provided on the printed board 80d are electrically connected to each other.

Figure 4A:
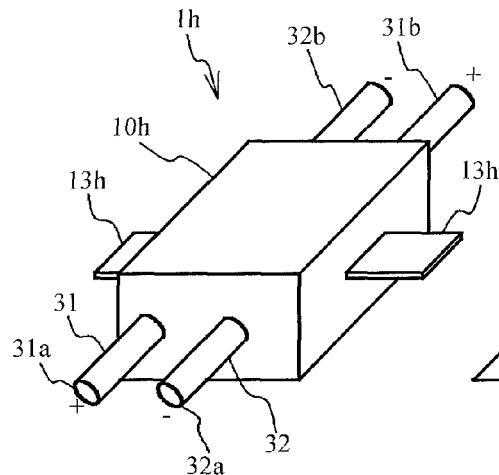
FIGS. 4A to 4D are explanatory views of the differential path replacement components.

A component 1h illustrated in FIG. 4A includes a chassis 10h. The chassis 10h is made of a metal. The chassis 10h has a substantially rectangular shape. An end portion 31a of a conductive wiring 31 and an end portion 32a of a conductive wiring 32 are exposed from the front side of the chassis 10h. An end portion 31b of the conductive wiring 31 and an end portion 32b of the conductive wiring 32 are exposed from the rear side of the chassis 10h. The conductive wirings 31 and 32 are conductive wirings of signal lines housed within the chassis 10h. Leads 13h are secured to both sides of the chassis 10h respectively.

Figure 4B:
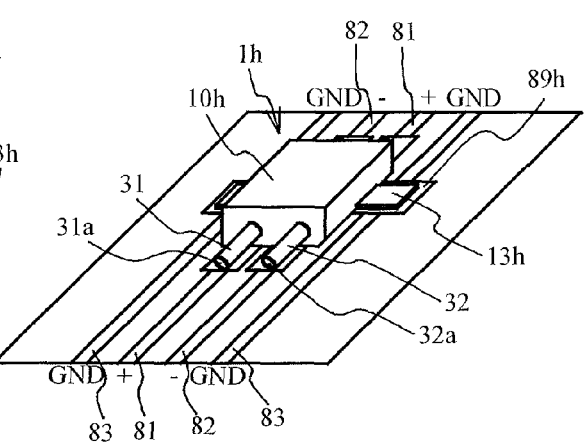

As illustrated in FIG. 4B, the component 1h is mounted in an opening 89h of a printed board 80h. The shape of the opening 89h corresponds to the shape of the component 1h. The conductive wirings 31 and 32 are respectively connected to the wirings 81 and 82 by soldering. Further, the leads 13h are respectively connected to the GND wirings 83 by soldering. Thus, the component 1h is mounted in the opening 89h, thereby suppressing the height of the component 1h when it is mounted.

Also, as illustrated in FIG. 4B, the horizontal heights of the wiring 81 and 82 are substantially identical to the horizontal heights of the end portions 31a, 32a, 31b, and 32b. For example, in cases where a grand layer is provided at an inner layer of a printed board, the difference in height between the grand layer and the transmission path provided on the surface of the printed board 80i can be suppressed. That is, the distance between the grand layer and the transmission path is made uniform if possible. This can suppress a problem caused when the distance between the grand layer and the transmission path are not uniform.

Figure 4C:
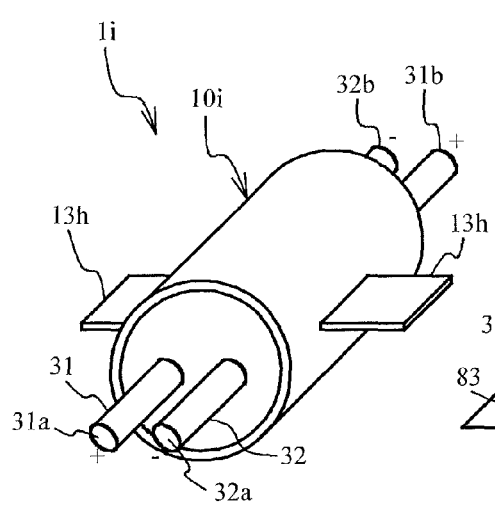
Figure 4D:
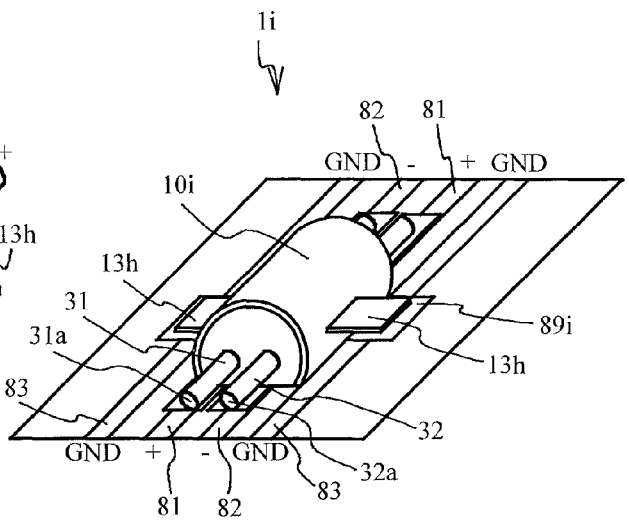

A chassis 10i of a component 1i illustrated in FIG. 4C has a substantially cylindrical shape and is made of a metal. Two signal lines are housed within the chassis 10i. The conductive wirings 31 and 32 of the two signal lines are exposed from the chassis 10i. Additionally, two signal lines are molded within the chassis 10i by a resin. As illustrated in FIG. 4D, the component 1i is mounted in an opening 89i, thereby suppressing the height of the mounted component 1i. Moreover, the distance between the grand layer and the transmission path can be uniform if possible.

Figure 5A:
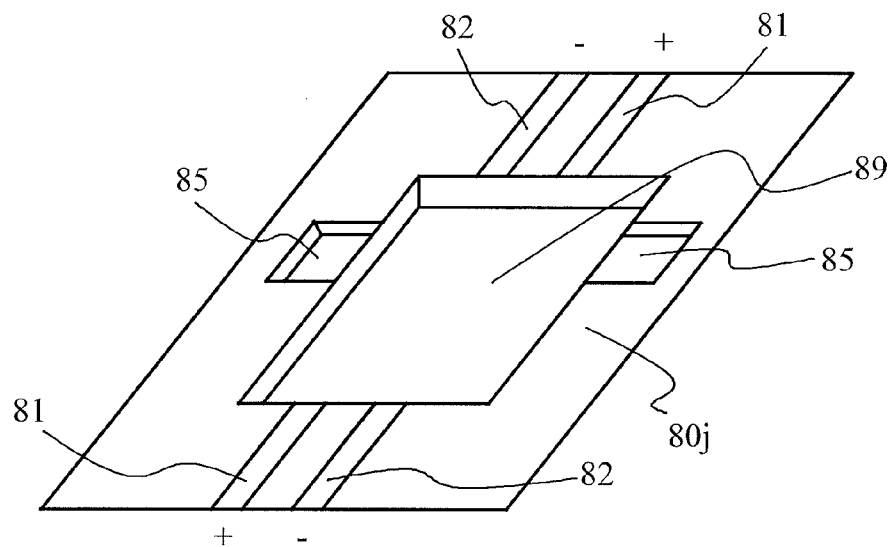
FIGS. 5A and 5B are explanatory views of variations of printed boards on which the differential path replacement component is mounted.
Figure 5B:
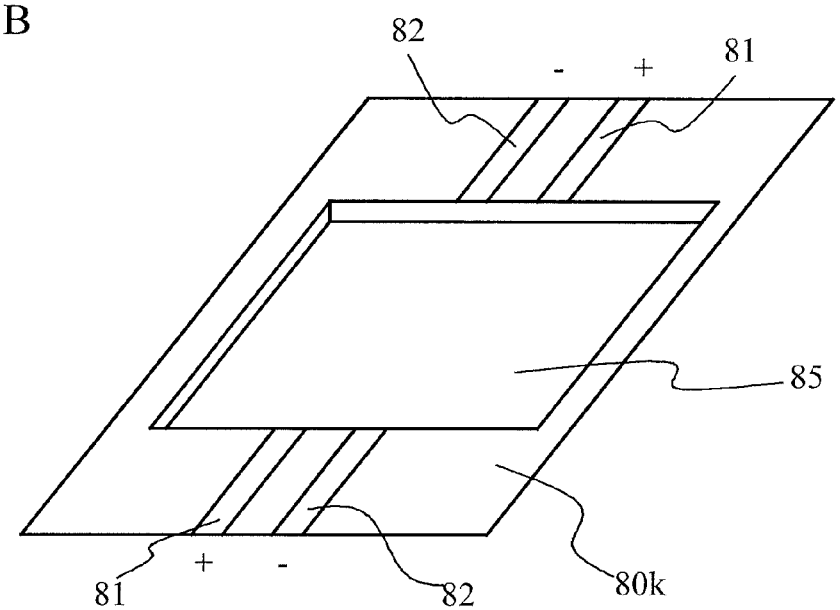

FIGS. 5A and 5B are explanatory views of variations of the printed board on which the differential path replacement component is mounted. As illustrated in FIG. 5A, an opening 89 has a rectangular shape. Also, a surface layer of a printed board 80j is chipped to expose a part of a grand layer 85 to a top side. When the component 1h or 1i mentioned above is mounted, the leads 13h are connected to the grand layer 85 by soldering. The printed board 80j is processed in this manner, in cases where there is no GND wiring mounted on the surface of the printed board, thereby ensuring the grand connection.

Further, the surface of a printed board 80k is chipped to expose a part of the grand layer 85 in a rectangular shape as illustrated in FIG. 5B. The opening is not provided in the printed board 80k illustrated in FIG. 5B. The component 1h may be mounted on the exposed surface of the grand layer 85, and the leads 13h may be connected to the grand layer 85 by soldering. Also, this can suppress the height of the component 1h when it is mounted.

Additionally, the printed board may be bored with the grand layer to form the opening, and the differential path replacement component without the grand terminal may be mounted in the opening. In this case, there is no grand layer just under the differential path replacement component. Thus, impedance can be also adjusted by such a method.

Figure 6A:
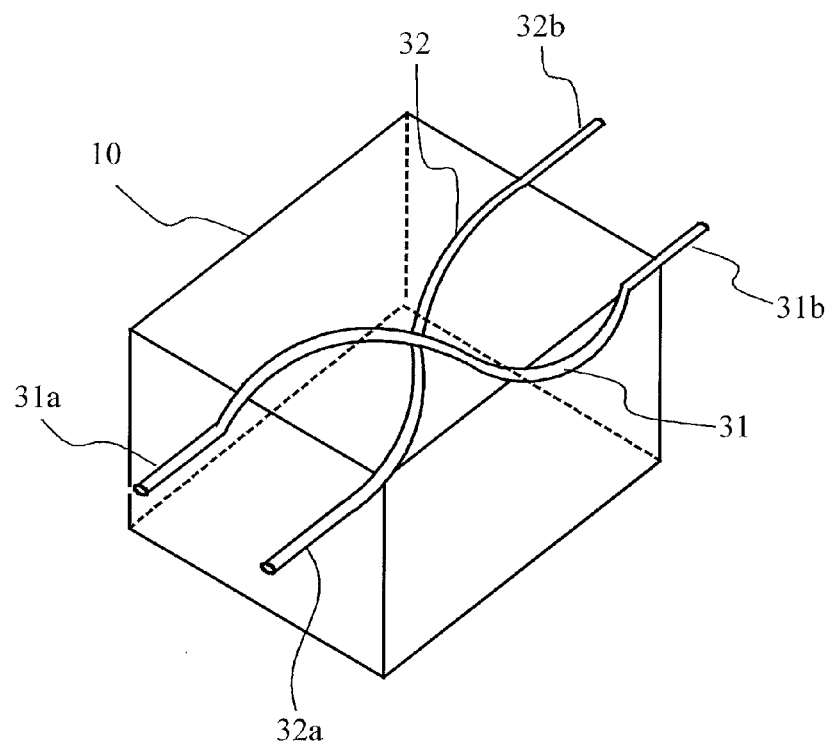
FIGS. 6A and 6B are explanatory views of an inner structure of the differential path replacement component.
Figure 6B:
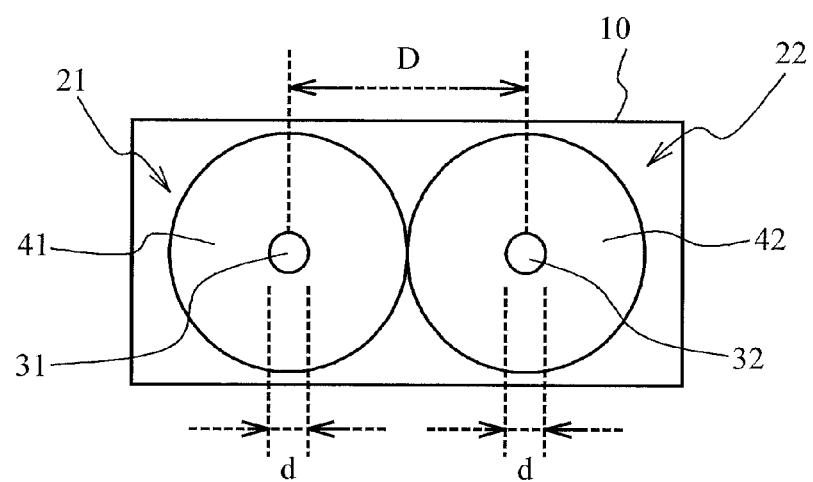

FIGS. 6A and 6B are explanatory views of an inner structure of the chassis 10. As illustrated in FIG. 6A, the conductive wirings 31 and 32 are twisted together. An order in which the end portions 31a and 32a are arranged is opposite to an order in which the end portions 31b and 32b are arranged. As illustrated in FIG. 6B, the two signal lines 21 and 22, housed within the chassis 10, include: cover portions 41 and 42; and the conductive wirings 31 and 32, respectively.

The conductive wirings 31 and 32 are covered respectively with the cover portions 41 and 42. The cover portions 41 and 42 have insulation characteristics. The cover portions 41 and 42 are made of, for example, a thermosetting resin such as polyurethane or polyimide. The diameters of the cover portions 41 and 42 are the same. For this reason, the interval between the conductive wirings 31 and 32 corresponds to the diameter of the cover portion 41 or 42.

Figure 7A:
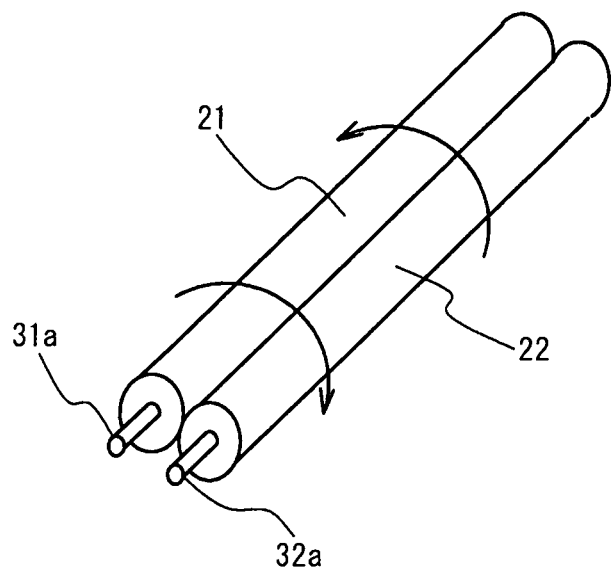
FIGS. 7A to 7C are explanatory views of a method for producing the differential path replacement component.
Figure 7B:
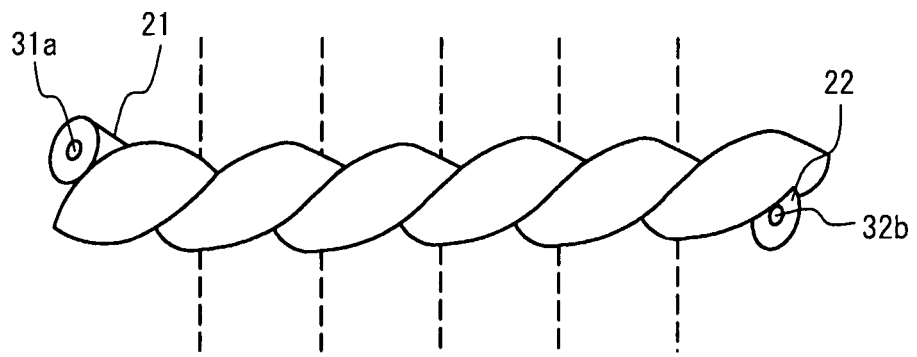
Figure 7C:
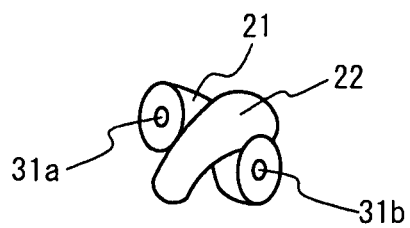

Next, a method for producing the differential path replacement component will be briefly described. FIGS. 7A to 7C are explanatory views of the method for producing the differential path replacement component. As illustrated in FIG. 7A, the two signal lines 21 and 22 are arranged laterally in contact with each other. The arranged signal lines 21 and 22 are twisted in the form of a twist shape as illustrated in FIG. 7B. In this state, the signal lines 21 and 22 are heated and then hardened. Next, the signal lines 21 and 22 are cut at a predetermined position so that the arranged sequence of one end of the signal line 21 and one end of the signal line 22 is reversed to the arranged sequence of the other end of the signal line 21 and the other end of the signal line 22. Therefore, the signal lines 21 and 22 are twisted together at 180 degrees as illustrated in FIG. 7C.

Next, cut end surfaces of the signal lines 21 and 22 are polished to be parallel with each other, and end portions 31a, 32a, 31b, and 32b of the conductive wirings 31 and 32 are exposed from the cover portions 41 and 42. The signal lines 21 and 22 produced in such a way are housed within the chassis 10. Next, the end portions 31a, 32a, 31b, and 32b are exposed from holes provided in the chassis 10. Next, the lead frames 11a, 12a, 11b, and 12b are secured to the outer surface of the chassis 10 to be electrically connected to the end portions 31a, 32a, 31b, and 32b, respectively. The component 1 is produced in such a way. Additionally, the number of the twisting of the signal lines 21 and 22 are not limited. Also, the signal lines 21 and 22 have only to be cut such that the arranged sequence of the other end of the signal line 21 and the other end of the signal line 22 is reversed to the original sequence. The cut signal lines 21 and 22 may be twisted at 540 or 900 degrees in addition to 180 degrees.

The interval between the conductive wirings 31 and 32 is constant, because the signal lines 21 and 22 are twisted with arranged side by side. Also, the lengths of the conductive wirings 31 and 32 are the same. Therefore, the interval between the wiring 31 of the signal line 21 and the wiring 32 of the signal line 22 housed within the chassis 10 is constant, and the lengths thereof are equal to each other. When the interval between the wirings 81 and 82 is constant and the lengths thereof are equal to each other, the component 1 is employed. Thus, the positional relationship between the transmission paths is changed with the interval between the transmission paths for transmitting the differential signals being constant and the lengths thereof being equal to each other. This improves the freedom degree of wiring provided on the printed board.

Also, the characteristic impedance of the component 1 is decided by the diameters d of the wirings 31 and 32, the interval D between the wirings 31 and 32, and dielectric constants of the cover portions 41 and 42, as illustrated in FIG. 6B. The relationships between them are adjusted, thereby obtaining a desired characteristic impedance.

Next, a description will be given of a differential path replacement component used as a jumper line. FIGS. 8A to 8D are explanatory views of the differential path replacement component used as a jumper line. As illustrated in FIG. 8B, a chassis 10j of a component 1j is made to be longer than the other component mentioned above. The component 1j is mounted on the surface of the printed board 80l. The component 1j is mounted to jump over a wiring 88 provided on the printed board 80l.

Figure 8A:
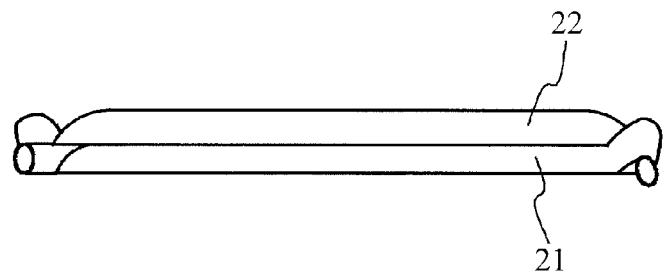
FIGS. 8A to 8D are explanatory views of the differential path replacement component used as a jumper line.
Figure 8B:
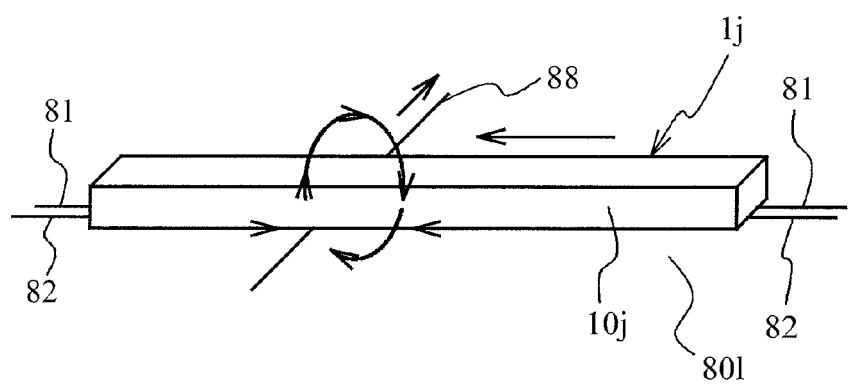
Figure 8C:
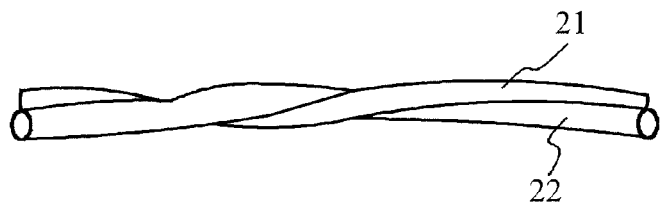
Figure 8D:
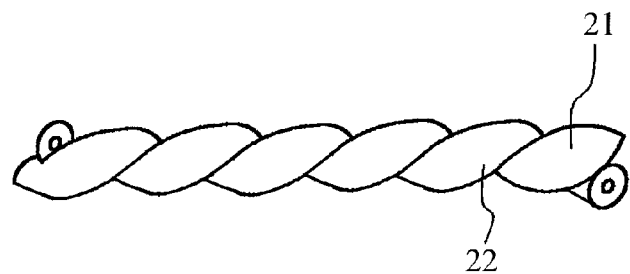

FIGS. 8A, 8C, and 8D are explanatory views of a method for twisting the signal lines 21 and 22 housed in the chassis 10j. As illustrated in FIG. 8A, the signal lines 21 and 22 are twisted in the vicinity of their ends. Also, as illustrated in FIG. 8C, the signal lines 21 and 22 may be twisted in their central portions. As illustrated in FIG. 8D, the signal lines 21 and 22 may be twisted several times.

Figure 9A:
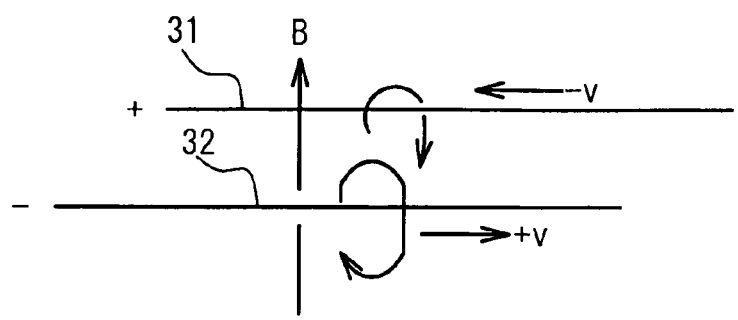
FIGS. 9A and 9B are explanatory views of the influence by noise.
Figure 9B:
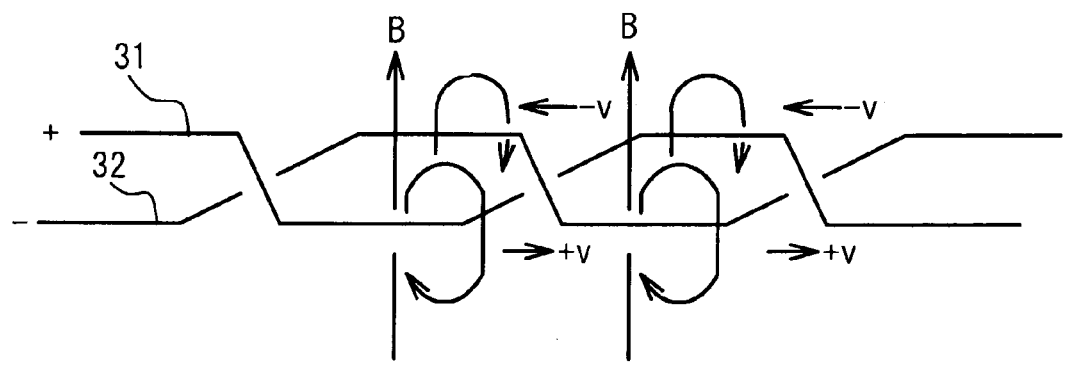

Thus, the influence made by noise is suppressed by twisting the signal lines 21 and 22 together. FIGS. 9A and 9B are explanatory views of the influence made by noise. As illustrated in FIG. 9A, the conductive wirings 31 and 32 are not twisted. When the magnetic field B is applied to the conductive wirings 31 and 32 in a given direction, the electromotive forces are generated in the conductive wirings 31 and 32. The direction in which the electromotive force is generated in the conductive wiring 31 is opposite to the direction in which the electromotive force is generated in the conductive wiring 32. The electromotive forces that are generated are the same with those of cases where data signals output to the conductive wirings 31 and 32, whereby the electromotive forces are received at a reception side together with the transmitted signal waveforms.

In FIG. 9B, the conductive wirings 31 and 32 are twisted together. Therefore, the conductive wirings 31 and 32 are partially replaced with each other. The electromotive force, generated in a part of the conductive wiring 31 which is not replaced, offsets the electromotive force generated in a part of the conductive wiring 31 which is positionally replaced. This applies to the electromotive force generated in the conductive wiring 32. Therefore, the differential signals can be transmitted with the influence of noise being suppressed.

Figure 10A:
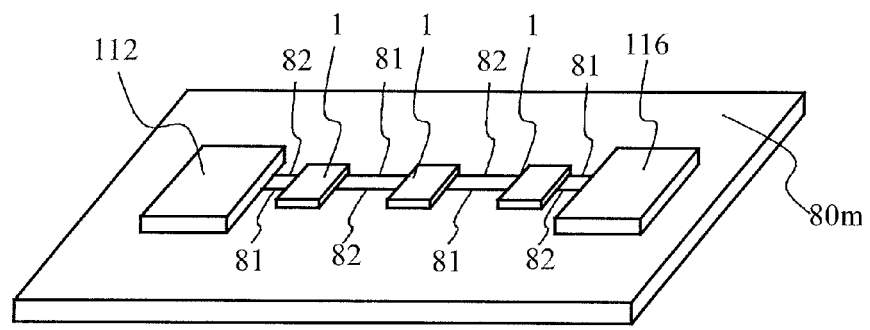
FIG. 10A is an explanatory view of a variation of a method for mounting the differential path replacement component.
Figure 10B:
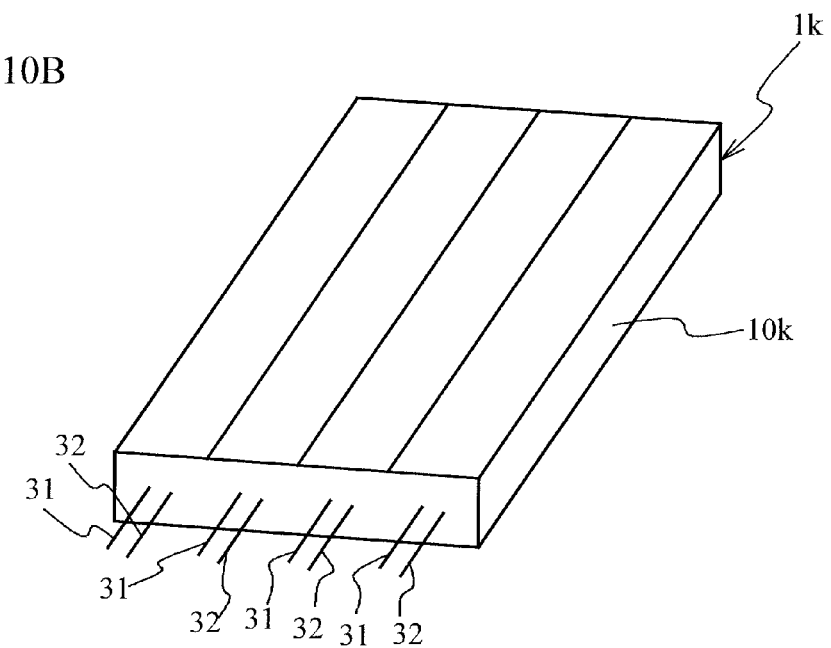
FIG. 10B is an explanatory view of a differential path replacement component for multiple channels.

FIG. 10A is an explanatory view of a variation of a method for mounting of the differential path replacement component. Plural components 1 are mounted between the MCH 112 and ICH 116 on a printed board 80m. Therefore, the positions of the wirings 81 and 82 are alternately replaced with each other. This also transmits the differential signals with the influence of noise being suppressed. FIG. 10B is an explanatory view of a differential path replacement component for multiple channels. As illustrated in FIG. 10B, plural pairs of signal lines are housed within a chassis 10k of a component 1k. The conductive wirings 31 and 32 of the signal lines are exposed from the chassis 10k.

Next, a description will be given of a problem that might occur in cases where the lengths of the paths for transmitting the differential signals are not equal to each other. In cases where the lengths of the paths for transmitting the differential signals are not equal to each other, there might arise a problem at characteristic impedances that are not unconformity. Generally, the frequency characteristic of the characteristic impedance of the transmission path is defined by a parameter for estimating the impedance matching degree between the transmission path and a terminator. This parameter is called return loss. When the positional relationship between the wiring for transmitting an N signal and the wiring for transmitting a P signal are partially replaced with each other on the printed board, it is difficult to satisfy this specification.

Most of return losses are degraded as the frequency is constant or higher. When the transmission path is terminated in the terminator matching with the impedance of a certain frequency point of the characteristic impedance changed depending on the frequency, and the impedance characteristic having undulation are out of the range of the impedance, the signal waveform of a bit pattern including the band component is drastically changed. This might increase the error rates to degrade the transmission quality.

Also, the lengths of the signal lines are unbalanced by replacing the parallel signal lines, thereby unbalancing the delay of the differential signals. When the wiring for transmitting the P signal and the wiring for transmitting the N signal are terminated by a single resistance only, the signal precedently arriving at the end flows to the other wiring and then acts as a noise (cross talk). Thus, the transmission quality is degraded.

Further, when there is a difference between the rise times of the P signal and the N signal or a difference between the fall times of the P signal and the N signal, the cross talk does not offset each other. This adversely influences the waveforms of the receiver. Also, when the speed of the rising or the falling of the signals is higher, the magnetic field is drastically changed by the drastic change of the signal, thereby increasing the influence on the cross talk.

Also, the cross talk is influenced by the difference in amplitude between the P signal and the N signal. The difference in the signal amplitude is caused by not only the difference in the driver output level but also by the loss depending on skin effect of a conductor, the difference in dielectric loss between insulators, and the unbalance between the paths of the differential transmission. The unbalance of the transmission paths influences not only skew between the P signal and the N signal in the transmission paths but also the transmission quality.

Also, as described with reference to FIGS. 9A and 9B, the noise is suppressed by replacing the positions of the transmission paths. For example, when the consumption of the electric current of the CPU 110 is drastically changed, a strong magnetic field is generated in the printed board. In cases where an output choke coil is used for the CPU power supply circuit 108, the magnetic circuit is partially cut, as generally called as gap. In other words, this is the same as releasing the leak magnetic flux in the air, and influences the parallel transmission paths. Also, when the printed board is small, it is difficult to arrange wirings spaced apart from the choke coil.

In order to increase the transmission rate, it is considered to use small level signals not needing the long rise time or the long fall time. In order to receive the small level signals, the original signal level and the noise has to be distinguished from each other. Thus, the characteristic of the S/N ratio has to be improved. In order to improve the S/N ratio, the transmission path should be made not to be influenced by noise and the signal level should be increased. The increase in the signal level is not suitable for the increase in transmission rate, because it takes a long time for the rise time and the fall time. The signal transmission employs the differential transmission, thereby suppressing the influence of noise generated from the signal ground. Consequently, the receiver receives doubled level signal by adding two signals with each other via the signal ground. Thus, a signal level is divided into half to transmit a small level signal, and then the receiver can receive the signal as a large level signal.

In order to achieve the high transmission rate, the amplitude of the signal level has to be decreased. In response to this, the S/N ratio has to be improved. Also, the above problems, such as a cross talk caused by reducing the rise time and the fall time, becomes more serious. However, the above problems can be avoided by employing the differential path replacement components according to the embodiments.

Also, the transmission quality is not considered in the invention disclosed in Japanese Unexamined Patent Application Publication No. 2004-95786. The invention is applicable to a noise filter to be arranged in the vicinity of a driver or a receiver, and is not applicable to the noise filter arranged at a middle position of the differential transmission path since the invention does not provide a structure in consideration of the characteristics of the transmission path.

Also, Japanese Unexamined Patent Application Publication No. 6-342964 discloses a method for curving the wirings to avoid unbalance of the lengths of the wirings. In this method, the wirings have to be wound and curved, and a special area for the wirings. Also, both wound lines are expanded and contracted, thereby forming a part periodically emitting noise. Also, both plus and minus lines are divided into a line with 0 resistance and a line without 0 resistance, whereby the high transmission rate is not expected.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the spirit and scope of the invention.

What is claimed is:

1. A differential path replacement component comprising:
a first signal line that comprises one end and the other end;
a second signal line that comprises one end adjacent to the one end of the first signal line and the other end adjacent to the other end of the first signal line, that transmits a signal having a phase opposite to a phase of a signal transmitted through the first signal line, and that is paired with the first signal line; and
a chassis that houses the first and second signal lines,
wherein, the first and second signal lines are twisted together such that an arranged sequence of one end of the first signal line and one end of the second signal line is reversed to an arranged sequence of the other end of the first signal line and the other end of the second signal line,
the first signal line comprises: a first conductive wiring; and a first cover portion covering the first conductive wiring,
the second signal line comprises: a second conductive wiring; and a second cover portion covering the second conductive wiring,
an interval between the first conductive wiring and the second conductive wiring within the chassis is constant, and
lengths of the first conductive wiring and the second conductive wiring within the chassis are equal to each other.

2. The differential path replacement component of claim 1, wherein the first and second signal lines are twisted together several times.

3. The differential path replacement component of claim 1, wherein the chassis comprises a grand terminal connected to a ground layer or a ground wiring of a printed board.

4. The differential path replacement component of claim 1, wherein the first and second conductive wirings are exposed to an outside of the chassis.

5. The differential path replacement component of claim 1, wherein a plurality of pairs of the first and second signal lines are housed within the chassis.

6. A printed board comprising:
a differential path replacement comprising:
- a first signal line that comprises one end and the other end;
- a second signal line that comprises one end adjacent to the one end of the first signal line and the other end adjacent to the other end of the first signal line, that transmits a signal having a phase opposite to a phase of a signal transmitted through the first signal line, and that is paired with the first signal line; and
- a chassis that houses the first and second signal lines,
- the first and second signal lines being twisted together such that an arranged sequence of one end of the first signal line and one end of the second signal line is reversed to an arranged sequence of the other end of the first signal line and the other end of the second signal line; and
a printed board body on which the differential path replacement component is mounted,
wherein, the first signal line comprises: a first conductive wiring; and a first cover portion covering the first conductive wiring,
the second signal line comprises: a second conductive wiring; and a second cover portion covering the second conductive wiring,
an interval between the first conductive wiring and the second conductive wiring within the chassis is constant, and
lengths of the first conductive wiring and the second conductive wiring within the chassis are equal to each other.

7. The printed board of claim 6, wherein a plurality of the differential path replacement components are arranged between wirings for transmitting differential signals between two electronic components mounted on the printed board body.

8. The printed board of claim 6, wherein the differential path replacement component is mounted on a front surface of the printed board body.

9. The printed board of claim 8, wherein the differential path replacement component is mounted to jump over a wiring provided at a surface of the printed board body.

10. The printed board of claim 6, wherein the differential path replacement component is mounted in an opening of the printed board body.

11. The printed board of claim 6, wherein
a front surface of the printed board body is partially chipped to expose a part of a grand layer provided in an inner layers of the printed board body, and
the differential path replacement component comprises a grand terminal connected to an exposed part of the grand layer.

12. An electronic device comprising a printed board,
the printed board comprising:
a differential path replacement comprising:
- a first signal line that comprises one end and the other end;
- a second signal line that comprises one end adjacent to the one end of the first signal line and the other end adjacent to the other end of the first signal line, that transmits a signal having a phase opposite to a phase of a signal transmitted through the first signal line, and that is paired with the first signal line; and
- a chassis that houses the first and second signal lines,
- the first and second signal lines being twisted together such that an arranged sequence of one end of the first signal line and one end of the second signal line is reversed to an arranged sequence of the other end of the first signal line and the other end of the second signal line; and
a printed board body on which the differential path replacement component is mounted,
wherein, the first signal line comprises: a first conductive wiring; and a first cover portion covering the first conductive wiring,
the second signal line comprises: a second conductive wiring; and a second cover portion covering the second conductive wiring,
an interval between the first conductive wiring and the second conductive wiring within the chassis is constant, and
lengths of the first conductive wiring and the second conductive wiring within the chassis are equal to each other.

* * * * *